(12) United States Patent
Mao et al.

(10) Patent No.: US 11,792,952 B2
(45) Date of Patent: Oct. 17, 2023

(54) ELECTRONIC DEVICE AND POWER DISTRIBUTION MODULE

(71) Applicant: Wistron Corporation, New Taipei (TW)

(72) Inventors: Zhong-Hui Mao, New Taipei (TW); Hua-Jun Liang, New Taipei (TW); Chih Yao Chou, New Taipei (TW)

(73) Assignee: Wistron Corporation, New Taipei (TW)

( * ) Notice: Subject to any disclaimer, the term of this patent is extended or adjusted under 35 U.S.C. 154(b) by 0 days.

(21) Appl. No.: 17/732,538

(22) Filed: Apr. 29, 2022

(65) Prior Publication Data

US 2023/0301013 A1 Sep. 21, 2023

(30) Foreign Application Priority Data

Mar. 16, 2022 (CN) .......................... 202210258414.9

(51) Int. Cl.
*H05K 5/02* (2006.01)
*H05K 7/14* (2006.01)

(52) U.S. Cl.
CPC ........... *H05K 7/1492* (2013.01); *H05K 5/023* (2013.01); *H05K 5/0208* (2013.01)

(58) Field of Classification Search
CPC ..... H05K 7/1492; H05K 5/0208; H05K 5/023
See application file for complete search history.

(56) References Cited

U.S. PATENT DOCUMENTS

| | | | |
|---|---|---|---|
| 9,122,458 B2* | 9/2015 | Yu | G06F 1/185 |
| 9,720,460 B2* | 8/2017 | Ganta | H05K 5/0221 |
| 10,168,747 B2* | 1/2019 | Zhu | H05K 7/1489 |
| 10,212,840 B2* | 2/2019 | Kuan | H05K 7/1487 |

* cited by examiner

*Primary Examiner* — Anthony Q Edwards
*Assistant Examiner* — Hung Q Dang
(74) *Attorney, Agent, or Firm* — JCIPRNET

(57) ABSTRACT

An electronic device, including a device body, a case, at least one power supply module, and a power distribution module, is provided. The case is disposed on the device body. The at least one power supply module is disposed in the case. The power distribution module includes a main body, a handle, and an anti-removal frame. The main body is detachably disposed on the device body. The handle is rotatably connected to the main body. The anti-removal frame is slidably disposed in the case. The power supply module is configured to push against the anti-removal frame, so that the anti-removal frame slides toward the handle and restricts the handle from rotating relative to the main body. In addition, a power distribution module configured for the electronic device is also provided.

19 Claims, 12 Drawing Sheets

ELECTRONIC DEVICE AND POWER DISTRIBUTION MODULE

CROSS-REFERENCE TO RELATED APPLICATION

This application claims the priority benefit of China application serial no. 202210258414.9, filed on Mar. 16, 2022. The entirety of the above-mentioned patent application is hereby incorporated by reference herein and made a part of this specification.

BACKGROUND

Technical Field

The disclosure relates to an electronic device and an electronic component, and more particularly to an electronic device and a power distribution module thereof.

Description of Related Art

With the development of servers, a stable power supply has become an essential basic requirement for servers. In view of this, recent servers are configured with multiple power supply modules to provide stable power, and the provided power is distributed through the power distribution module. The power distribution module is plugged into the server body, and the power supply modules are respectively plugged into the power distribution module, so that each power supply module supplies power to the server through the power distribution module.

However, the insertion direction of the power supply module plugged into the power distribution module is usually different from the disassembly direction of the power distribution module plugged into the server body. Therefore, in the case where the user directly removes the power distribution module without first removing the power supply module, the docking structure between the power supply module and the power distribution module may be easily damaged due to the forced movement of the power distribution module.

SUMMARY

The disclosure provides an electronic device and a power distribution module, which can prevent damage to a docking structure between a power supply module and the power distribution module.

The electronic device of the disclosure includes a device body, a case, at least one power supply module, and a power distribution module. The case is disposed on the device body. The at least one power supply module is disposed in the case. The power distribution module includes a main body, a handle, and an anti-removal frame. The main body is detachably disposed on the device body. The handle is rotatably connected to the main body. The anti-removal frame is slidably disposed in the case. The power supply module is configured to push against the anti-removal frame, so that the anti-removal frame slides toward the handle and restricts the handle from rotating relative to the main body.

The power distribution module of the disclosure is configured for an electronic device. The power distribution module includes a main body, a handle, and an anti-removal frame. The main body is detachably disposed on the device body. The handle is rotatably connected to the main body. The anti-removal frame slidably cooperates with the handle to prevent the handle from rotating relative to the main body.

In an embodiment of the disclosure, the power distribution module includes at least one elastic member, and the at least one elastic member is connected between the case and the anti-removal frame, so that the anti-removal frame slides relative to the case.

In an embodiment of the disclosure, the power distribution module includes a frame body, the frame body is disposed on the device body, the frame body is provided with at least one guide groove, the main body has at least one guide protrusion, and the at least one guide protrusion and the at least one guide groove cooperate to move the main body toward a motherboard connector of the device body.

In an embodiment of the disclosure, the power distribution module includes a frame body, the frame body is disposed on the device body, the frame body is provided with at least one first pushing portion and at least one second pushing portion, the handle is provided with at least one first pushing protrusion and at least one second pushing protrusion, when the handle is rotated from a releasing position to a locking position, the first pushing protrusion pushes against the first pushing portion to drive the main body to move toward a motherboard connector of the device body, and when the handle is rotated from the locking position to the releasing position, the second pushing protrusion pushes against the second pushing portion to drive the main body away from the motherboard connector.

In an embodiment of the disclosure, the frame body is provided with at least one extension wall, and an opposite upper edge and lower edge of the extension wall respectively constitute the at least one first pushing portion and the at least one second pushing portion.

In an embodiment of the disclosure, the frame body is provided with at least one slot, and when the handle is rotated from the locking position to the releasing position, the at least one first pushing protrusion moves along the at least one slot, and an inner edge of the at least one slot constitutes the at least one first pushing portion.

In an embodiment of the disclosure, the frame body is provided with at least one notch and at least one extension wall, and the at least one extension wall extends from an inner edge of the at least one notch and defines the at least one slot together with the at least one notch.

In an embodiment of the disclosure, the at least one slot is L-shaped.

In an embodiment of the disclosure, the power distribution module includes a frame body, the frame body is disposed on the device body, the frame body is provided with at least one guiding inclined surface, and the at least one guiding inclined surface is configured to guide the main body to move toward a motherboard connector of the device body.

In an embodiment of the disclosure, the handle is provided with a grip portion, and the grip portion is configured to receive a force to rotate the handle relative to the main body and is configured to be stopped by the anti-removal frame.

Based on the above, in the electronic device of the disclosure, when the user disposes the power supply module into the case, the anti-removal frame is restricted to the stopping position to stop the handle at the locking position. As such, before the user rotates the handle to release the power distribution module, he must first remove the power supply module to move the anti-removal frame away from the stopping position. The electronic device of the disclosure can prevent the docking structure of the power supply module and the power distribution module from being damaged due to the forced movement of the power distribution module.

DETAILED DESCRIPTION OF DISCLOSED EMBODIMENTS

Figure 1:
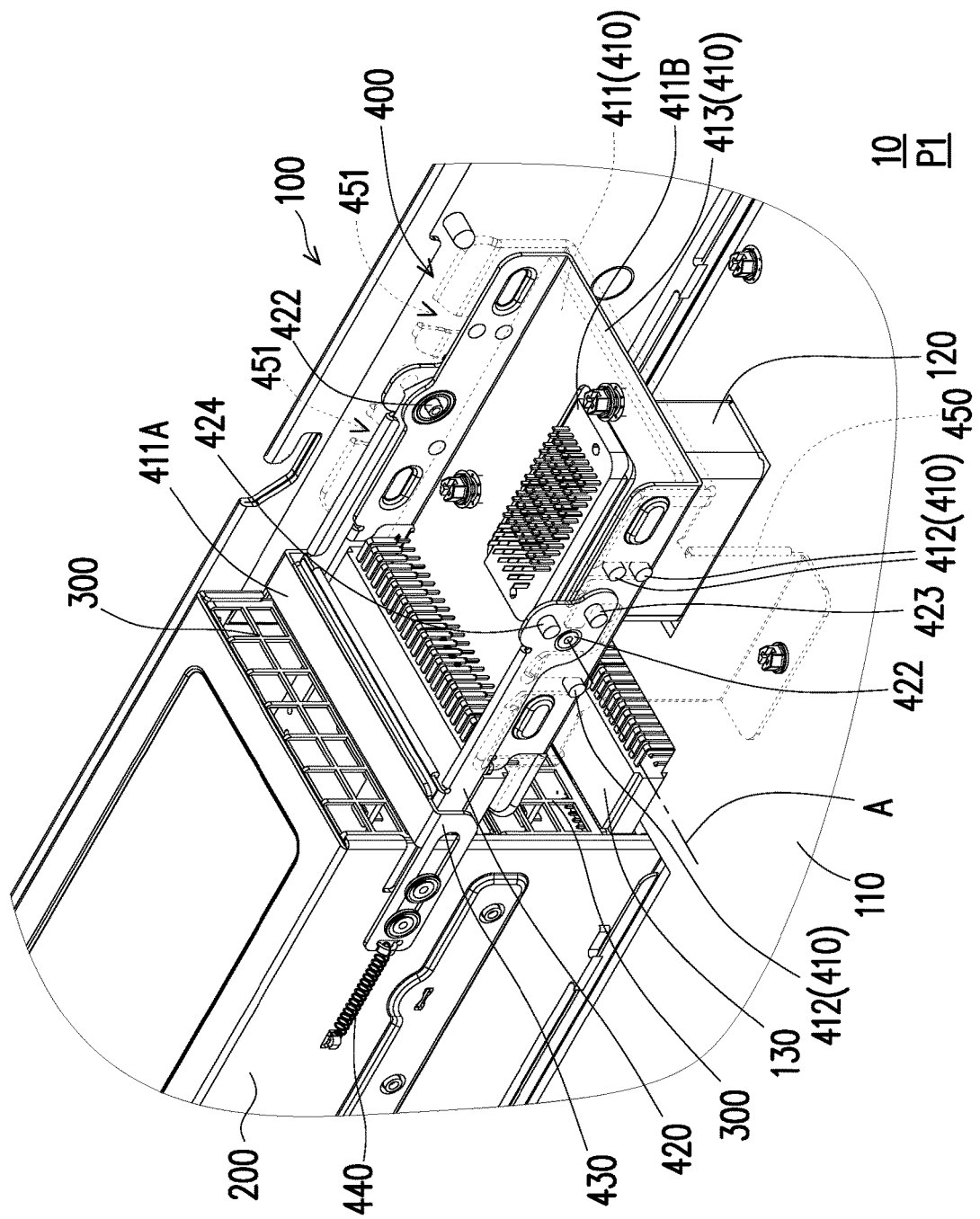
FIG. 1 is a perspective view of an electronic device according to an embodiment of the disclosure.
Figure 2:
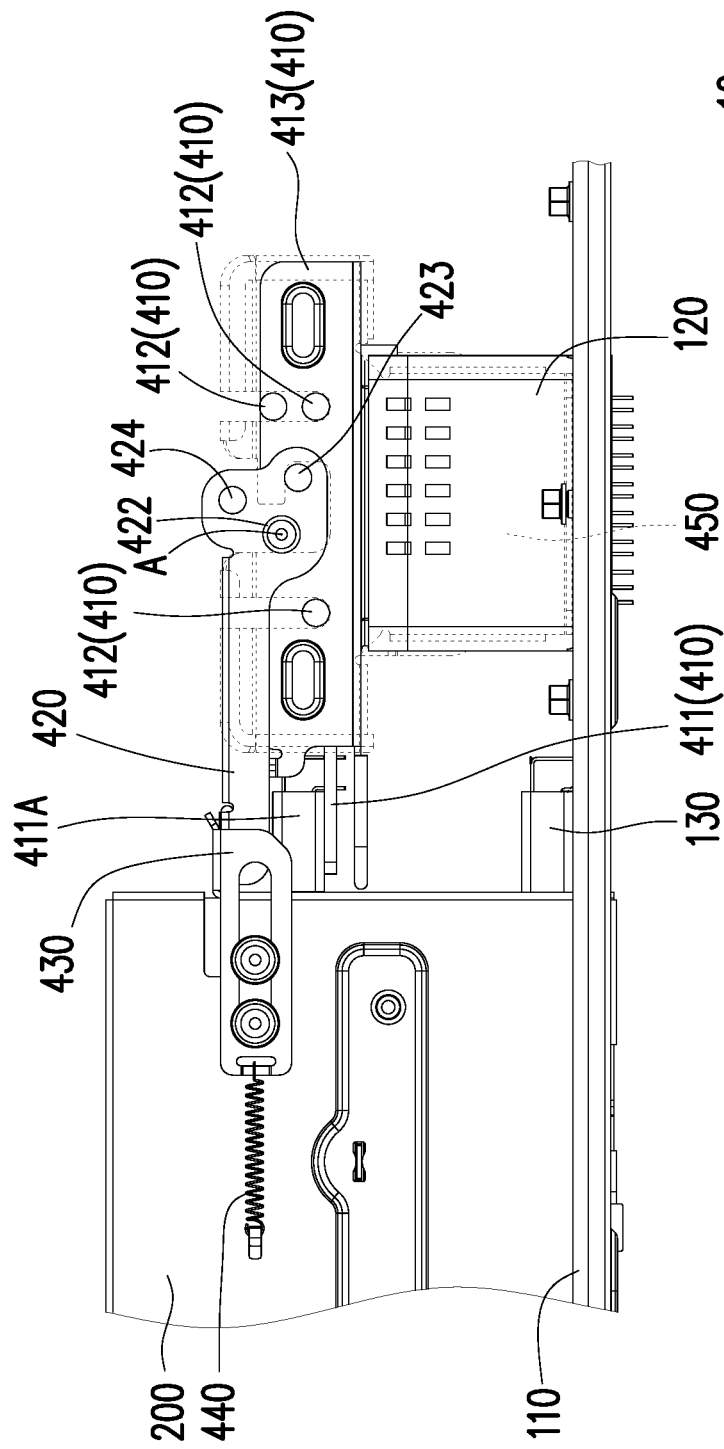
FIG. 2 is a side view of the electronic device of FIG. 1.

FIG. 1 is a perspective view of an electronic device according to an embodiment of the disclosure, and FIG. 2 is a side view of the electronic device of FIG. 1. Please refer to FIG. 1 and FIG. 2. An electronic device 10 of the embodiment includes a device body 100, a case 200, at least one power supply module 300, and a power distribution module 400. The number of the at least one power supply module 300 may be two. The case 200 is disposed on the device body 100. The power supply modules 300 are respectively disposed in an upper layer and a lower layer of the case 200. The power distribution module 400 includes a main body 410, a handle 420, and an anti-removal frame 430, wherein the main body 410 is detachably disposed on the device body 100, the handle 420 is rotatably connected to the main body 410 with a rotational axis A as the axis, the anti-removal frame 430 is slidably disposed in the case 200, and the power supply module 300 in the upper layer of the case 200 pushes against the anti-removal frame 430, so that the anti-removal frame 430 slides to a stopping position P1, and the anti-removal frame 430 at the stopping position P1 stops the handle located at a locking position P2 to prevent the handle 420 from rotating relative to the main body 410.

Under such configuration, the user must first remove the power supply module 300 disposed in the upper layer of the case 200 from the case 200 to move the anti-removal frame 430 away from the stopping position P1 before the user can rotate the handle 420 with the rotational axis A as the axis and remove the main body 410 of the power distribution module 400 from the device body 100. In this way, when the user removes the power distribution module 400, it is possible to prevent the docking structure of the power supply module 300 and the power distribution module 400 from being damaged due to the forced movement generated by an improper removal process of the power distribution module 400.

Figure 3:
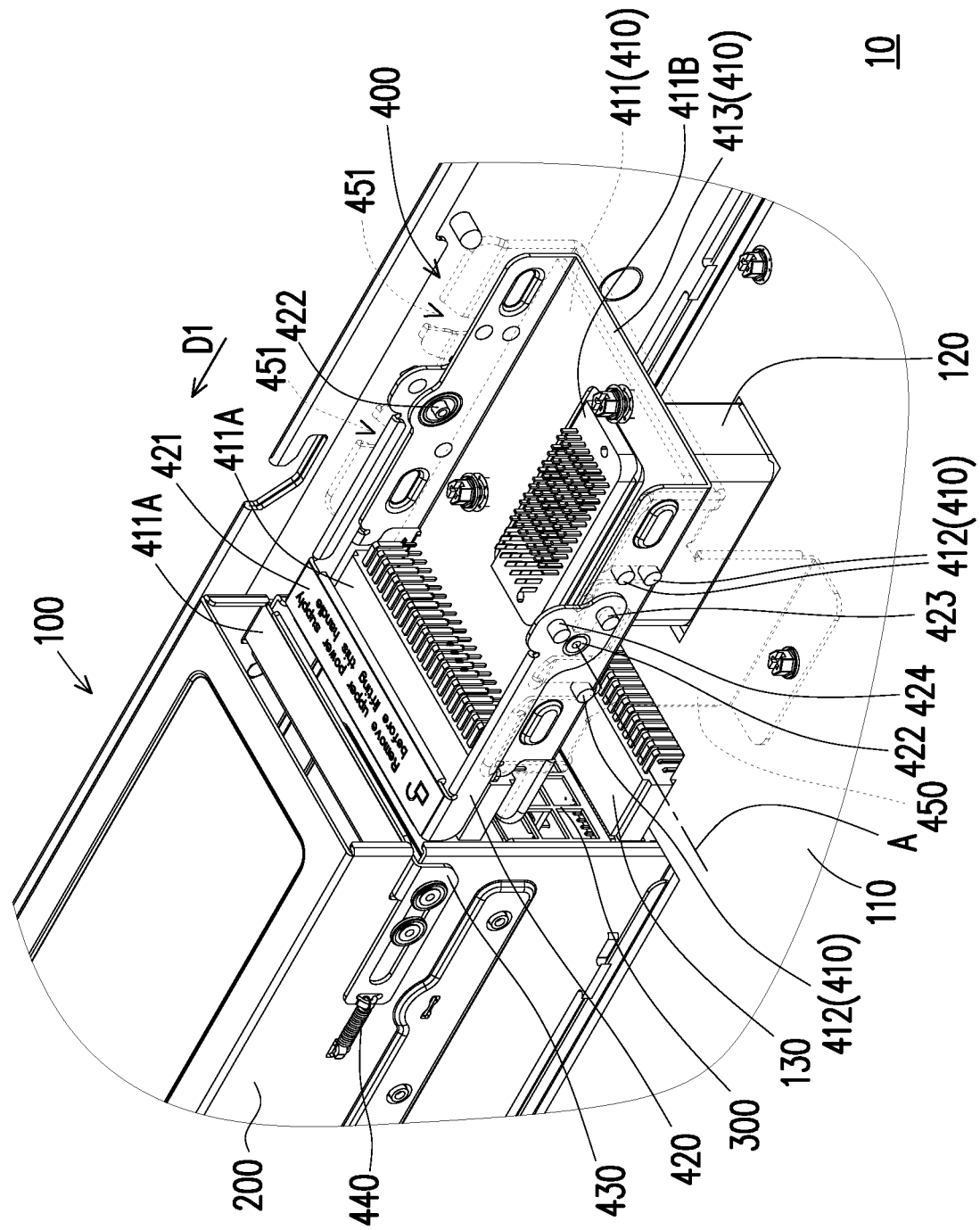
FIG. 3 is a perspective view of some components of the electronic device of FIG. 1.
Figure 4:
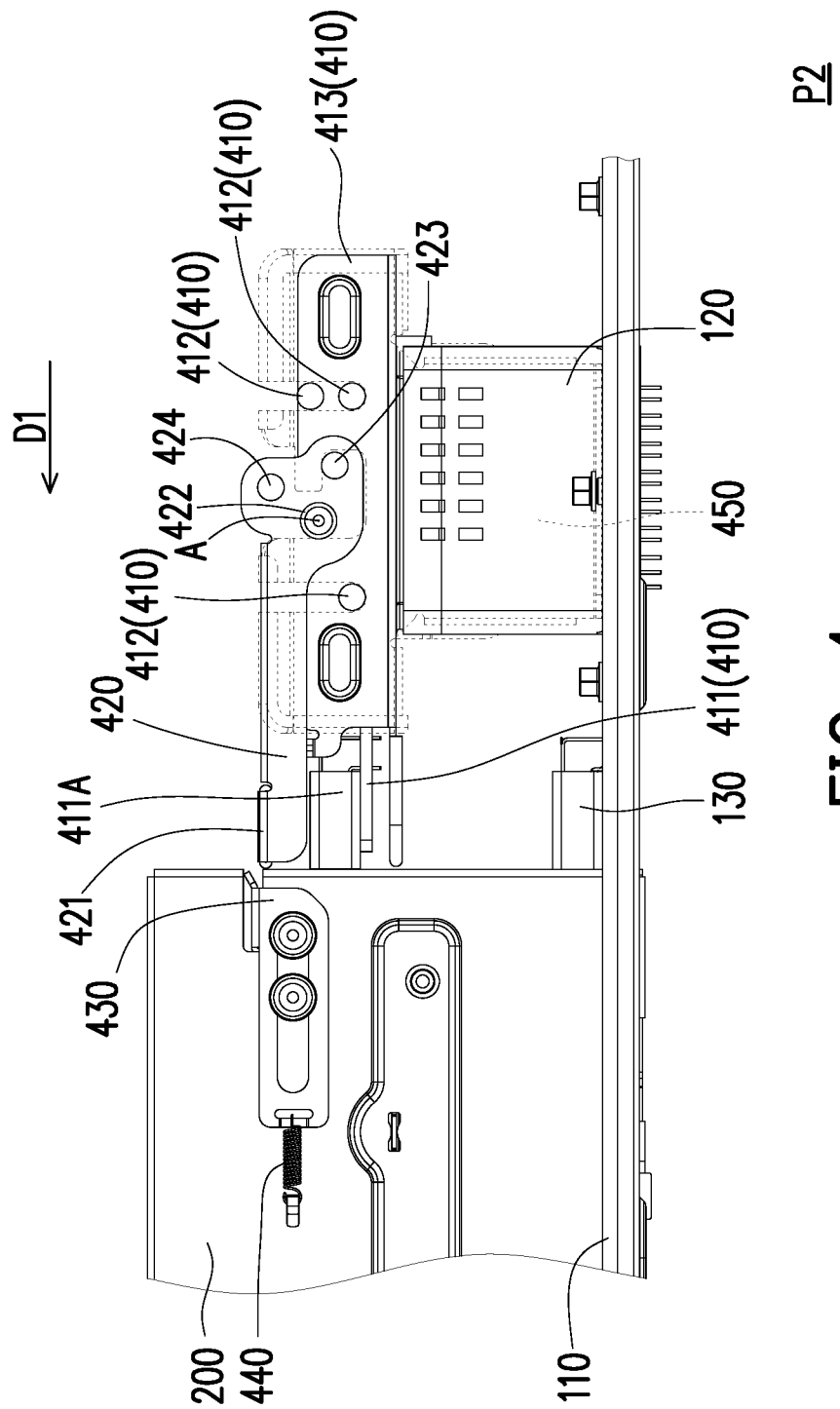
FIG. 4 is a side view of the electronic device of FIG. 3.

FIG. 3 is a perspective view of some components of the electronic device of FIG. 1, and FIG. 4 is a side view of the electronic device of FIG. 3. Please refer to FIG. 2 to FIG. 4. Further, the power distribution module 400 of the embodiment includes at least one elastic member 440. The elastic member 440 is connected between the case 200 and the anti-removal frame 430. When the power supply module 300 is disposed in the upper layer of the case 200, and the anti-removal frame 430 slides to the stopping position P1, the elastic member 440 generates an elastic force along an action direction D1 as a result of being stretched. When the power supply module 300 disposed in the upper layer of the case 200 moves away from the case 200 to release the anti-removal frame 430, the anti-removal frame 430 moves away from the stopping position P1 along the action direction D1 by the elastic force of the elastic member 440.

In the embodiment, the handle 420 is provided with a grip portion 421 and a pivot portion 422. The grip portion 421 is configured to receive a force to rotate the pivot portion 422 relative to the main body 410 with the rotational axis A as the axis. When the power supply module 300 disposed in the upper layer of the case 200 pushes against the anti-removal frame 430, the anti-removal frame 430 slides to the stopping position P1, and the anti-removal frame 430 stops the grip portion 421 as shown in FIG. 2 to stop the rotation of the handle 420 relative to the main body 410. In other embodiments, the anti-removal frame 430 may stop other parts of the handle 420, which is not limited in the disclosure.

In the embodiment, the main body 410 of the power distribution module 400 includes a power adapter board 411, and the power adapter board 411 is configured with a first connector 411A and a second connector 411B. In addition, the device body 100 includes a motherboard 110, a motherboard connector 120, and a third connector 130. The motherboard connector 120 and the third connector 130 are both disposed on the motherboard 110. The first connector 411A is configured to connect the power supply module 300 located in the upper layer of the case 200 as shown in FIG. 1. The second connector 411B is configured to connect with the motherboard connector 120, so that the main body 410 is detachably disposed on the device body 100. The third connector 130 is configured to connect the power supply module 300 located in the lower layer of the case 200 as shown in FIG. 1.

Figure 5:
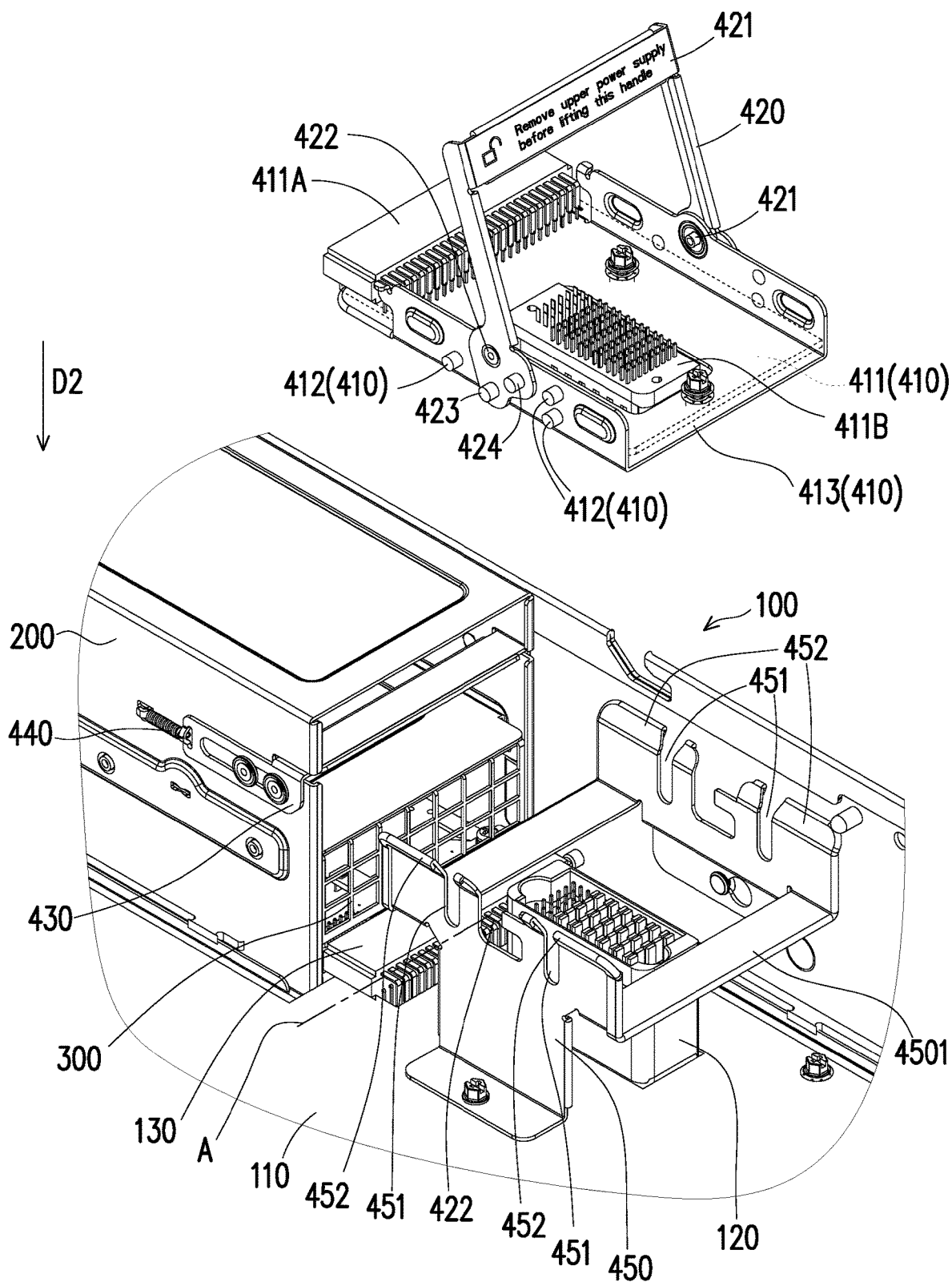
FIG. 5 is a perspective view of removing a power distribution module of FIG. 3 from a device body.

FIG. 5 is a perspective view of removing a power distribution module of FIG. 3 from a device body. Please refer to FIG. 3 and FIG. 5. The power distribution module 400 of the embodiment includes a frame body 450. The frame body 450 is disposed on the device body 100. The frame body 450 is provided with at least one guide groove 451. The main body 410 is provided with at least one guide protrusion 412. The guide protrusion 412 is slidably disposed in the guide groove 451. The main body 410 is configured to be disposed on the device body 100 along a sliding direction D2 by guiding the guide protrusion 412 by the guide groove 451, so that the main body 410 moves toward the motherboard connector 120 of the device body 100 to plug the second connector 411B into the motherboard connector 120. The cooperation relationship between the guide groove 451 and the guide protrusion 412 is configured to restrict the process of disposing and removing the main body 410 from the device body 100 to the sliding direction D2.

In the embodiment, the frame body 450 has at least one guiding inclined surface 452. The number of the at least one guiding inclined surface 452 is two. The guiding inclined surface 452 is configured to guide the main body 410 to move toward the motherboard connector 120 of the device body 100, so that the main body 410 may be disposed on the device body 100.

Figure 6A:
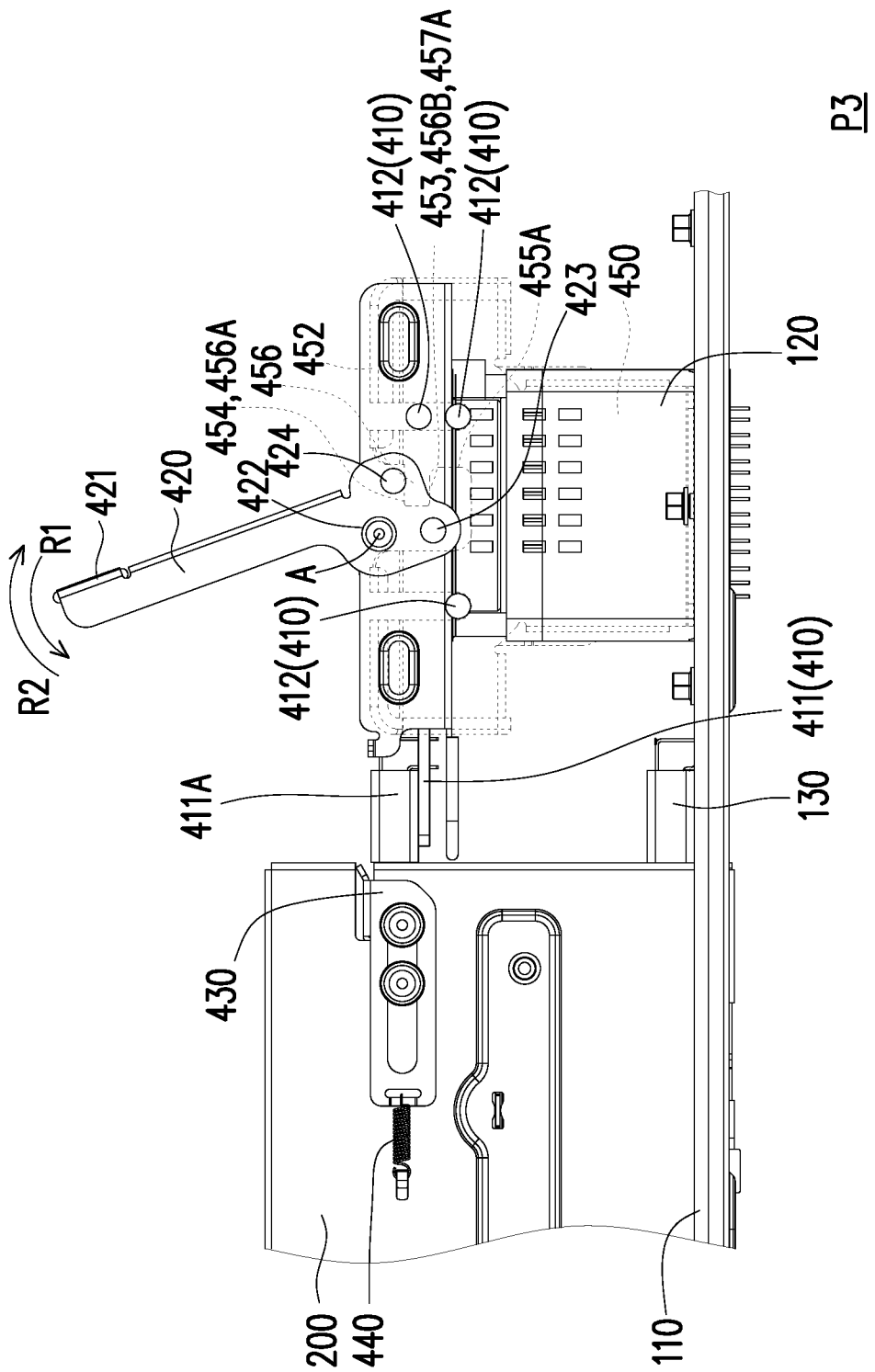
FIG. 6A and FIG. 6B are operational flowcharts of disposing the power distribution module of FIG. 5 to a device body.
Figure 6B:
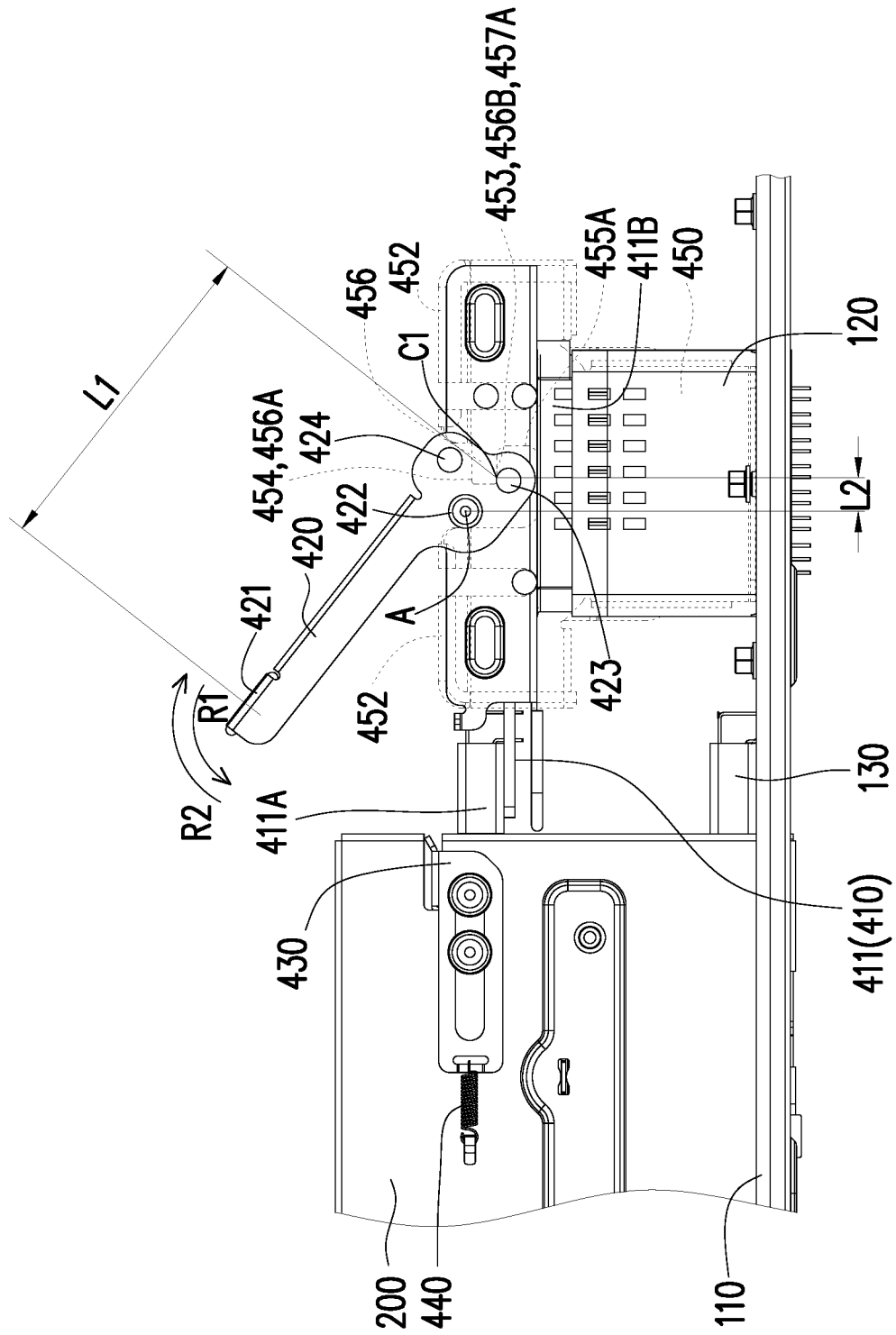

The overall operation of installing the power distribution module 400 onto the device body 100 of the embodiment will be described below. FIG. 6A and FIG. 6B are operational flowcharts of disposing the power distribution module of FIG. 5 to a device body. Please refer to FIG. 4, FIG. 6A, and FIG. 6B. The frame body 450 of the embodiment has at least one first pushing portion 453 and at least one second pushing portion 454, and the handle 420 has at least one first pushing protrusion 423 and at least one second pushing protrusion 424. When the power distribution module 400 is installed onto the device body 100, the main body 410 of the power distribution module 400 is first placed on the frame body 450, and the second pushing protrusion 424 of the handle is abutted against the second pushing portion 454 of the frame body at this time. Next, when the handle is rotated from a releasing position P3 shown in FIG. 6A to the locking position P2 shown in FIG. 4 with the rotational axis A as the axis, the handle 420 is first rotated from the releasing position P3 to the position shown in FIG. 6B along a rotation direction R1, the first pushing protrusion 423 is abutted against the first pushing portion 453, and the second pushing protrusion 424 leaves the second pushing portion 454. The handle 420 is then rotated from the position shown in FIG. 6B to the locking position P2 along the rotation direction R1, the first pushing protrusion 423 pushes against the first pushing portion 453 to drive the main body 410 to move toward the motherboard connector 120 of the device body 100 to plug the second connector 411B into the motherboard connector 120.

Figure 7:
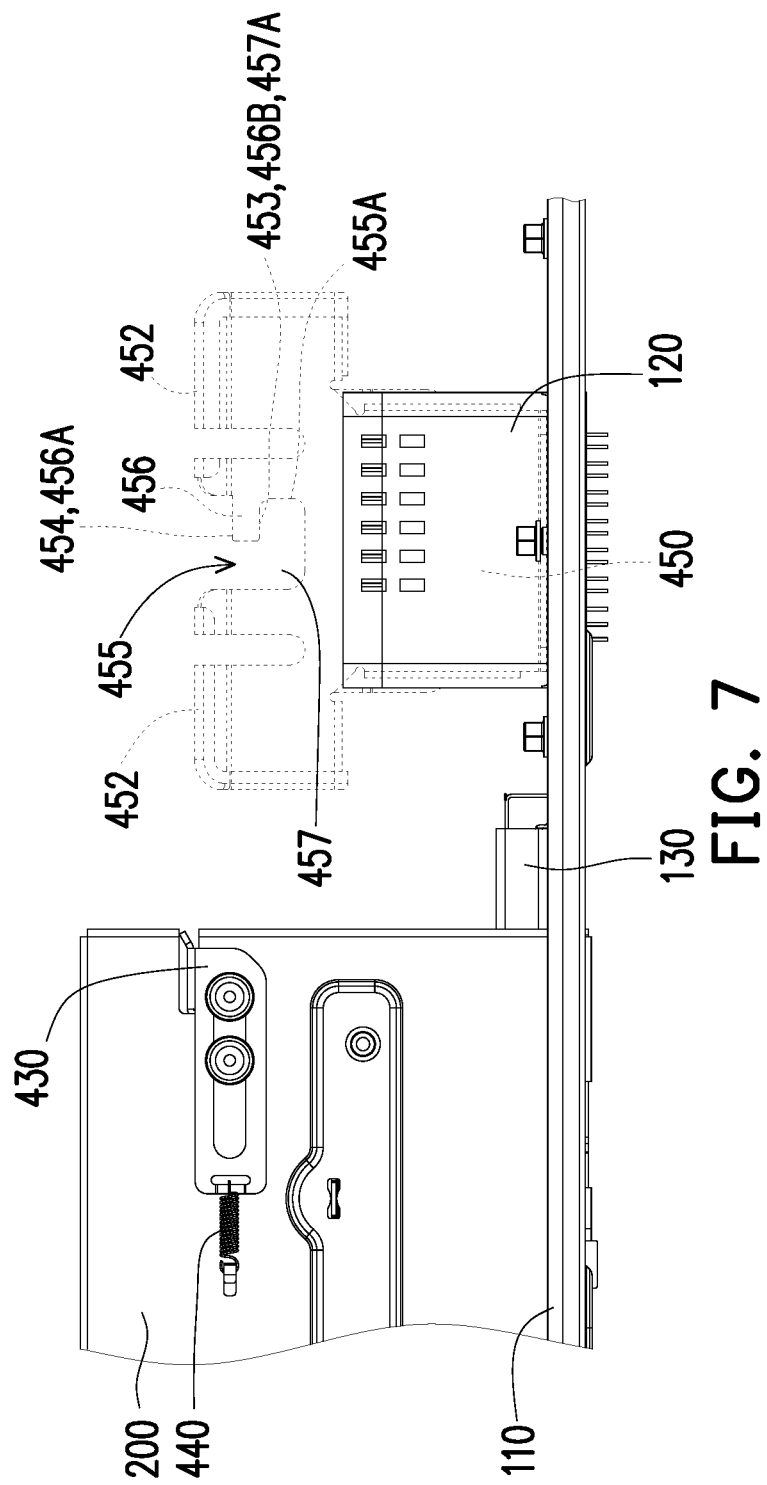
FIG. 7 is a side view of the device body of FIG. 5.

The structure of the frame body 450 of the embodiment will be described in detail below. FIG. 7 is a side view of the device body of FIG. 5. Please refer to FIG. 5 and FIG. 7. The frame body 450 of the embodiment is provided with at least one notch 455 and at least one extension wall 456. The numbers of the at least one notch 455 and the at least one extension wall 456 are both two. The extension wall 456 extends from an inner edge 455A of the notch 455 and defines at least one slot 457 together with the notch 455. The number of the at least one slot 457 is two and the appearance is L-shaped. The extension wall 456 has an upper edge 456A and a lower edge 456B opposite to each other. The opposite lower edge 456B and upper edge 456A of the extension wall 456 respectively constitute the first pushing portion 453 and the second pushing portion 454, and an inner edge 457A of the slot 457 constitutes the first pushing portion 453.

When the handle 420 is rotated from the position shown in FIG. 6B to the locking position P2 shown in FIG. 4 along the rotation direction R1, the rotating handle 420 may be regarded as a lever mechanism. A contact point C1 of the first pushing protrusion 423 and the first pushing portion 453 is the fulcrum, a distance L1 from the grip portion 421 of the handle 420 to the contact point C1 is the force arm, and a distance L2 from the pivot portion 422 to the contact point C1 is the resistance arm. Since the length of the force arm L1 is greater than the length of the resistance arm L2, the user only needs to provide a force less than the frictional force between the second connector 411B and the motherboard connector 120 to rotate the handle 420 to the locking position P2 to connect the second connector 411B to the motherboard connector 120, which saves effort.

Figure 8:
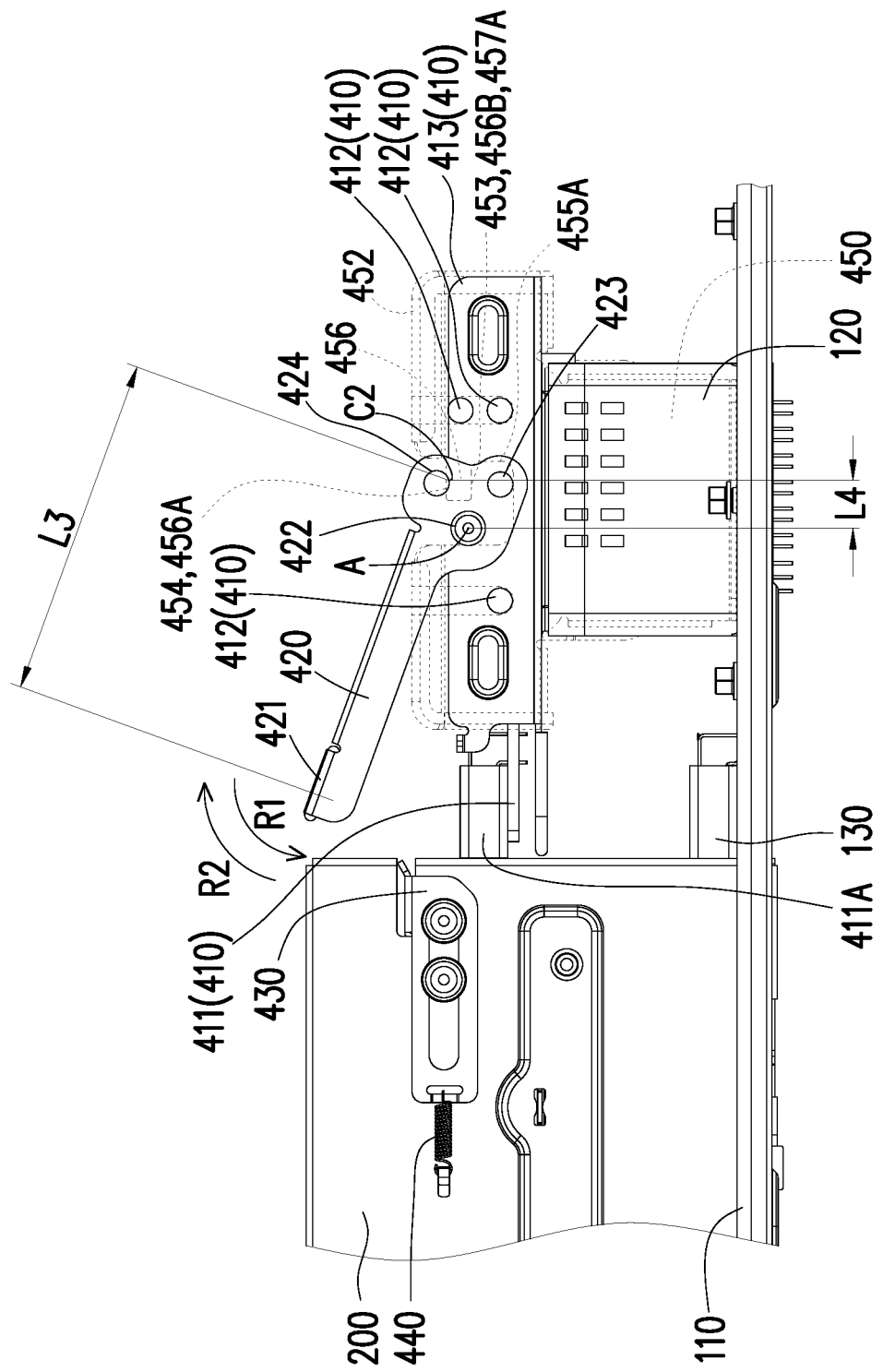
FIG. 8 is a side view of removing the power distribution module of FIG. 5 from a device body.

The following describes the overall operation of removing the power distribution module 400 of the embodiment from the device body 100. FIG. 8 is a side view of removing the power distribution module of FIG. 5 from a device body. Please refer to FIG. 4, FIG. 6A, and FIG. 8. In the embodiment, the user may also rotate the handle 420 from the locking position P2 shown in FIG. 4 to the releasing position P3 shown in FIG. 6A with the rotational axis A as the axis. When the handle 420 is rotated from the locking position P2 to the releasing position P3, the handle 420 is rotated to the position shown in FIG. 8 along the rotation direction R2. At this time, the second pushing protrusion 424 is abutted against the second pushing portion 454. The handle 420 is then rotated from the position shown in FIG. 8 to the releasing position P3 shown in FIG. 6A along the rotation direction R2. The first pushing protrusion 423 moves along the slot 457, and the second pushing protrusion 424 pushes against the second pushing portion 454 to drive the main body 410 away from the motherboard connector 120 to remove the second connector 411B from the motherboard connector 120.

When the handle 420 is rotated from the position shown in FIG. 6B to the releasing position P3 along the rotation direction R2, the rotating handle 420 may be regarded as a lever mechanism. A contact point C2 of the second pushing protrusion 424 and the second pushing portion 454 is the fulcrum, a distance L3 from the grip portion 421 of the handle 420 to the contact point C2 is the force arm, and a distance L4 from the pivot portion 422 to the contact point C2 is the resistance arm. Since the length of the force arm L3 is greater than the length of the resistance arm L4, the user only needs to provide a force less than the frictional force between the second connector 411B and the motherboard connector 120 to rotate the handle 420 to the releasing position P3 to remove the second connector 411B from the motherboard connector 120, which saves effort.

Figure 9:
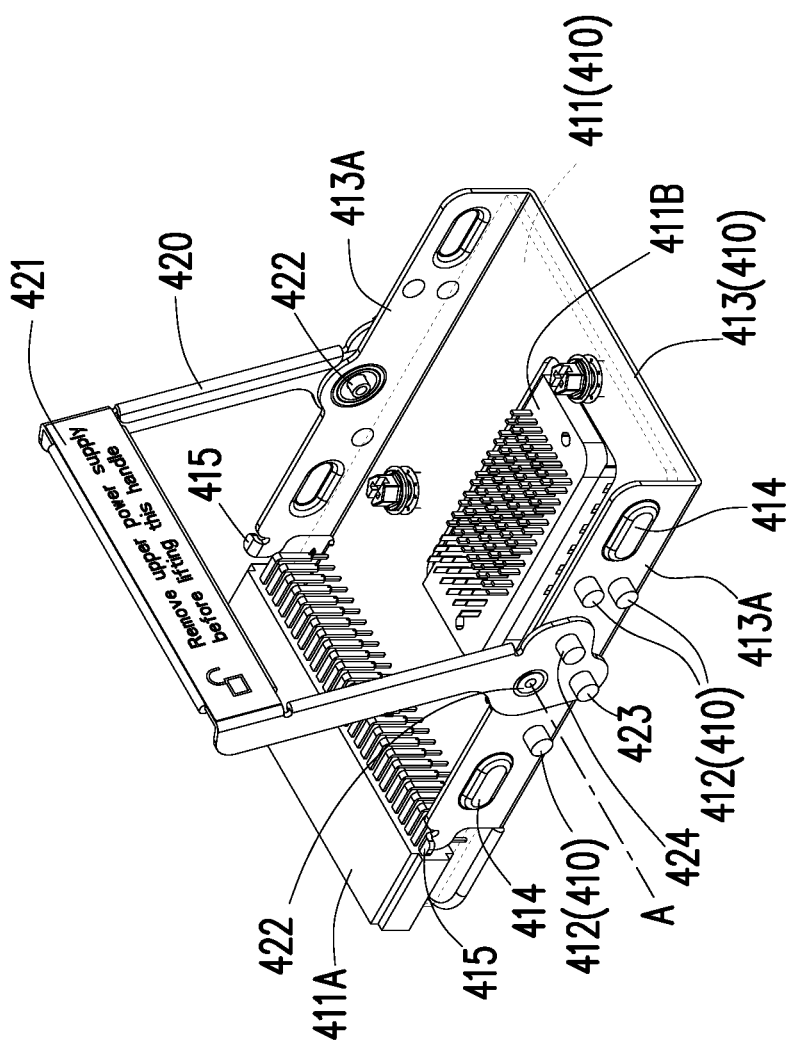
FIG. 9 is a perspective view of the power distribution module of FIG. 5.

FIG. 9 is a perspective view of the power distribution module of FIG. 5. Please refer to FIG. 3, FIG. 5, and FIG. 9. The main body 410 of the embodiment includes a tray 413, at least one boss 414, and at least one stopping portion 415. The handle 420 is rotatably connected to two side walls 413A of the tray 413. The boss 414 is disposed on and protrudes from the two side walls 413A of the tray 413. The stopping portion 415 is disposed on the two side walls 413A of the tray 413. When the tray 413 is carried on a carrying portion 4501 of the frame body 450, the boss 414 is abutted against the frame body 450 and a space is kept between the frame body 450 and the side wall 413A to ensure that the handle 420 can rotate with the rotational axis A as the axis without contacting the frame body 450. When the handle 420 is rotated to the locking position P2, the stopping portion 415 is configured to abut against and stopping the handle 420 to precisely position the handle 420 at the locking position P2.

Figure 10:
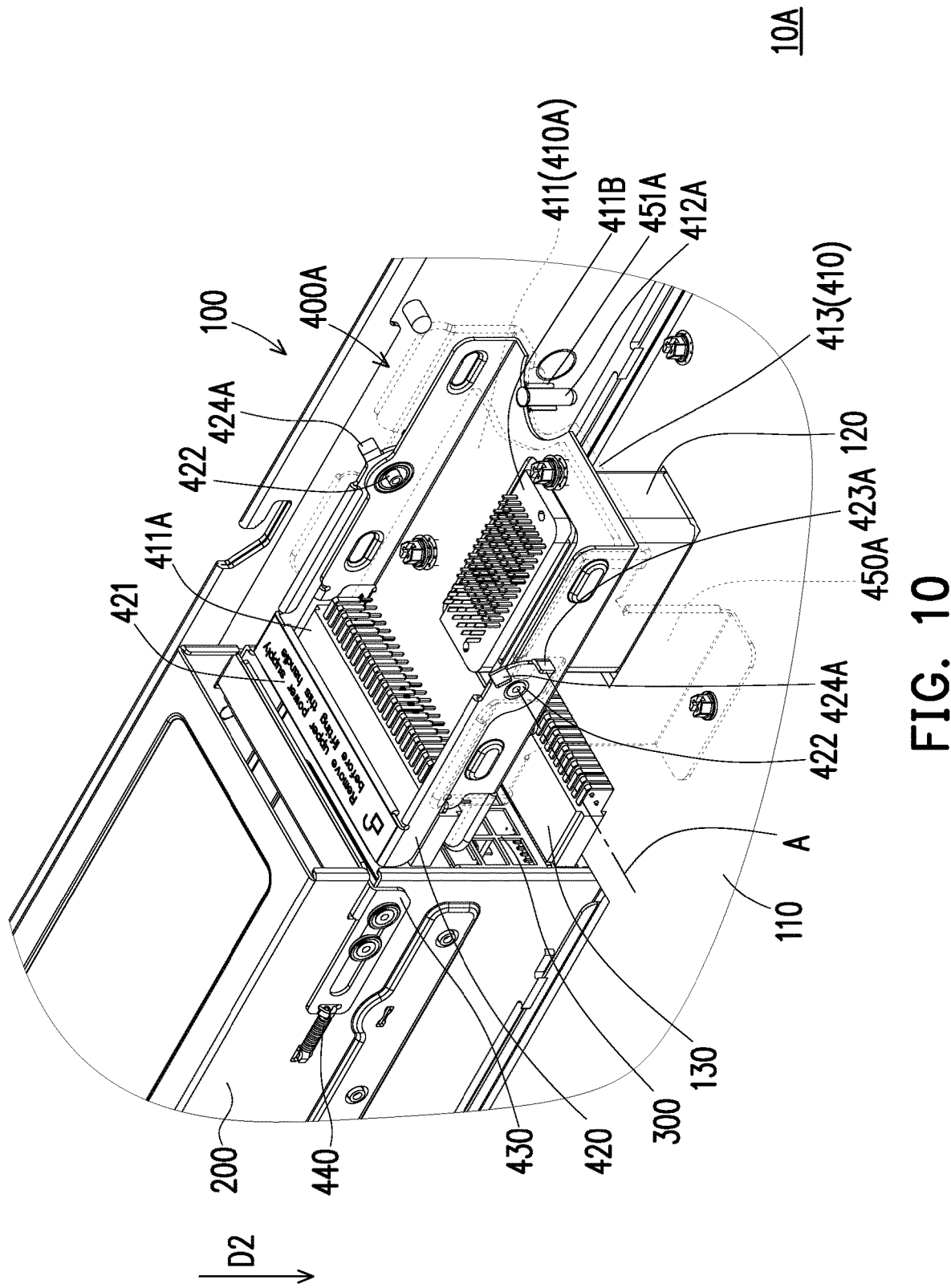
FIG. 10 is a perspective view of an electronic device according to another embodiment of the disclosure.
Figure 11:
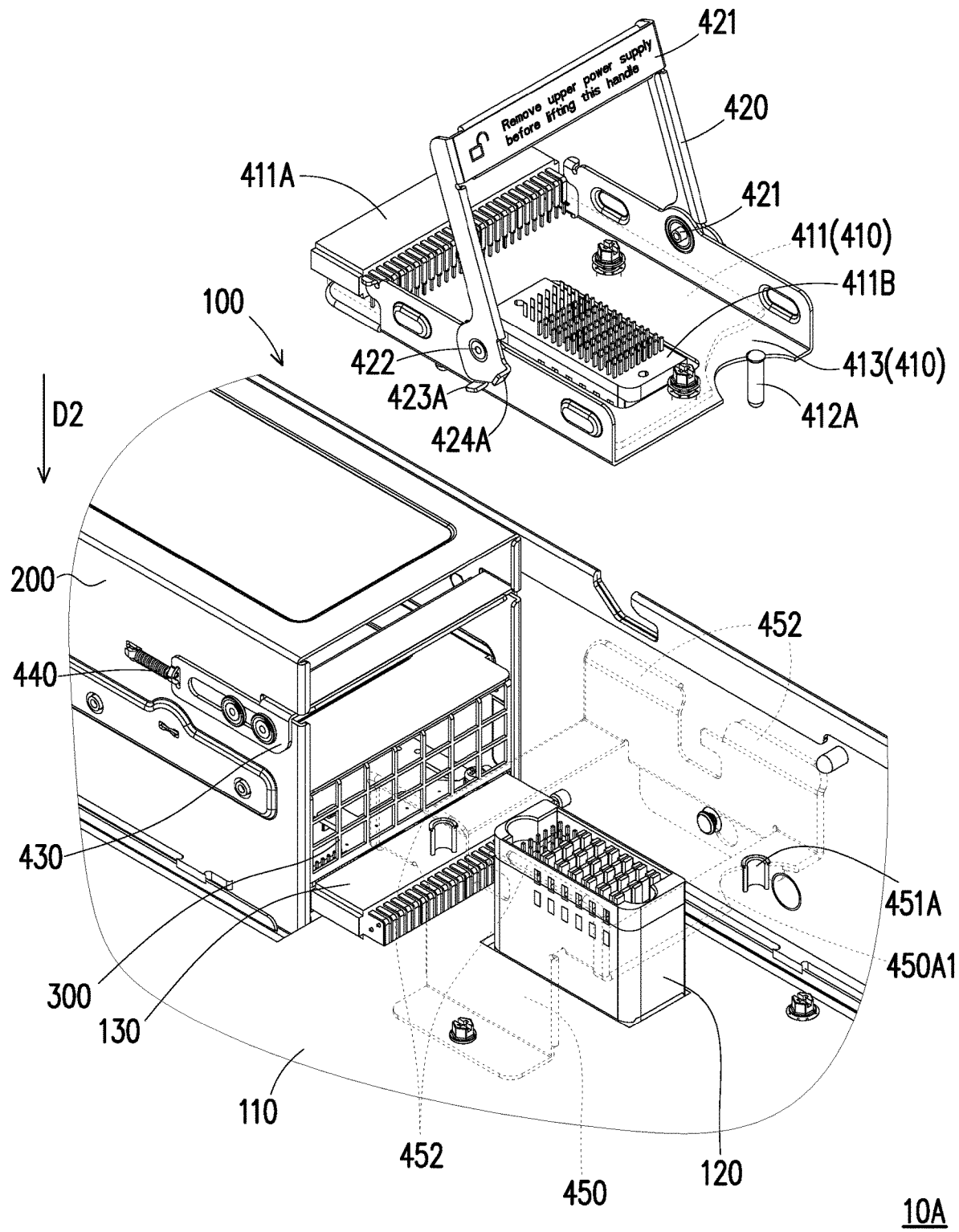
FIG. 11 is a perspective view of removing a power distribution module of FIG. 10 from a device body.

FIG. 10 is a perspective view of an electronic device according to another embodiment of the disclosure, and FIG. 11 is a perspective view of removing a power distribution module of FIG. 10 from a device body. Please refer to FIG. 10 and FIG. 11. An electronic device 10A according to another embodiment of the disclosure includes a power distribution module 400A. The power distribution module 400A includes a frame body 450A. The frame body 450A is provided with at least one guide groove 451A. A main body 410A is provided with at least one guide protrusion 412A. The differences between the guide groove 451A and the guide protrusion 412A of the embodiment shown in FIG. 11 and the guide groove 451 and the guide protrusion 412 of the embodiment shown in FIG. 5 are that the guide groove 451 is disposed on two side walls (not numbered) of the frame body 450 and the guide protrusion 412 is disposed on the two side walls 413A of the tray 413 of the main body 410. However, the guide groove 451A is located on a carrying portion 450A1 of the frame body 450A and the guide protrusion 412A is located on a bottom portion of the main body 410A. The guide protrusion 412A is plugged into the guide groove 451A. The main body 410A is configured to be disposed on the device body 100 along the sliding direction D2 by guiding the guide protrusion 412A by the guide groove 451A to plug the second connector 411B into the motherboard connector 120. The cooperation relationship between the guide groove 451A and the guide protrusion 412A is configured to restrict the process of disposing and removing the main body 410A from the device body 100 to the sliding direction D2.

The electronic device 10A according to another embodiment of the disclosure includes a handle 420A. The handle 420A is rotatably connected to the main body 410A. The handle 420A has at least one first pushing protrusion 423A and at least one second pushing protrusion 424A. The first pushing protrusion 423A and the second pushing protrusion 424A are formed by bending the handle 420A and are configured to push against the frame body 450A to drive the power distribution module 400A to be disposed or removed from the device body 100. The operational process is the same as that in the previous embodiment and is not repeated here.

In summary, in the electronic device of the disclosure, when the user disposes the power supply module into the case, the anti-removal frame is restricted to the stopping position to stop the handle at the locking position. As such, before the user rotates the handle to release the power distribution module, he must first remove the power supply module to move the anti-removal frame away from the stopping position. The electronic device of the disclosure can prevent the docking structure of the power supply module and the power distribution module from being damaged due to the forced movement of the power distribution module. In addition, when the second connector of the main body is to be connected to or removed from the motherboard connector, the force arm of the handle is always greater than the resistance arm, so that the user only needs to provide a force less than the frictional force between the second connector and the motherboard connector to remove or connect the second connector to the motherboard connector, which saves effort.

What is claimed is:

1. An electronic device, comprising:
   a device body;
   a case, disposed in the device body;
   at least one power supply module, disposed in the case; and
   a power distribution module, comprising a main body, a handle, and an anti-removal frame, wherein the main body is detachably disposed on the device body, the handle is rotatably connected to the main body, the anti-removal frame is slidably disposed in the case, and the power supply module is configured to push against the anti-removal frame, so that the anti-removal frame slides toward the handle and restricts the handle from rotating relative to the main body.

2. The electronic device according to claim 1, wherein the power distribution module comprises at least one elastic member, and the at least one elastic member is connected between the case and the anti-removal frame, so that the anti-removal frame slides relative to the case.

3. The electronic device according to claim 1, wherein the power distribution module comprises a frame body, the frame body is disposed on the device body, the frame body is provided with at least one guide groove, the main body has at least one guide protrusion, and the at least one guide protrusion and the at least one guide groove cooperate to move the main body toward a motherboard connector of the device body.

4. The electronic device according to claim 1, wherein the power distribution module comprises a frame body, the frame body is disposed on the device body, the frame body is provided with at least one first pushing portion and at least one second pushing portion, the handle is provided with at least one first pushing protrusion and at least one second pushing protrusion, when the handle is rotated from a releasing position to a locking position, the first pushing protrusion pushes against the first pushing portion to drive the main body to move toward a motherboard connector of the device body, and when the handle is rotated from the locking position to the releasing position, the second pushing protrusion pushes against the second pushing portion to drive the main body away from the motherboard connector.

5. The electronic device according to claim 4, wherein the frame body is provided with at least one extension wall, and opposite lower edge and upper edge of the extension wall respectively constitute the at least one first pushing portion and the at least one second pushing portion.

6. The electronic device according to claim 4, wherein the frame body is provided with at least one slot, when the handle is rotated from the locking position to the releasing position, the at least one first pushing protrusion moves along the at least one slot, and an inner edge of the slot constitutes the at least one first pushing portion.

7. The electronic device according to claim 6, wherein the frame body is provided with at least one notch and at least one extension wall, and the at least one extension wall extends from an inner edge of the at least one notch and defines the at least one slot together with the at least one notch.

8. The electronic device according to claim 6, wherein the at least one slot is L-shaped.

9. The electronic device according to claim 1, wherein the power distribution module comprises a frame body, the frame body is disposed on the device body, the frame body is provided with at least one guiding inclined surface, and the at least one guiding inclined surface is configured to guide the main body to move toward a motherboard connector of the device body.

10. The electronic device according to claim 1, wherein the handle is provided with a grip portion, and the grip portion is configured to receive a force to rotate the handle relative to the main body and is configured to be stopped by the anti-removal frame.

11. A power distribution module, configured for an electronic device, comprising:
    a main body, detachably disposed on a device body of the electronic device;
    a handle, rotatably connected to the main body; and
    an anti-removal frame, slidably cooperating with the handle to prevent the handle from rotating relative to the main body,
    wherein the anti-removal frame is disposed in a case of the electronic device, the power distribution module further comprises at least one elastic member, the at least one elastic member is connected between the case and the anti-removal frame, and the anti-removal frame is slidable relatively to the case through the elastic member,
    wherein the anti-removal frame is moved away selectively from the handle by an elastic force of the elastic member.

12. The power distribution module according to claim 11, comprising a frame body, wherein the frame body is disposed on the device body, the frame body has at least one guide groove, the main body has at least one guide protrusion, and the at least one guide groove and the at least one guide protrusion cooperate with each other.

13. The power distribution module according to claim 11, comprising a frame body, wherein the frame body is disposed on the device body, the frame body is provided with at least one first pushing portion and at least one second pushing portion, the handle is provided with at least one first pushing protrusion and at least one second pushing protrusion, when the handle is rotated from a releasing position to a locking position, the first pushing protrusion pushes against the first pushing portion to drive the main body to move toward the frame body, and when the handle is rotated from the locking position to the releasing position, the second pushing protrusion pushes against the second pushing portion to drive the main body away from the frame.

14. The power distribution module according to claim 13, wherein the frame body is provided with at least one extension wall, and an opposite upper edge and lower edge of the extension wall respectively constitute the at least one first pushing portion and the at least one second pushing portion.

15. The power distribution module according to claim 13, wherein the frame body is provided with at least one slot, when the handle is rotated from the locking position to the releasing position, the at least one first pushing protrusion moves along the at least one slot, and an inner edge of the at least one slot constitutes the at least one first pushing portion.

16. The power distribution module according to claim 15, wherein the frame body is provided with at least one notch and at least one extension wall, and the at least one extension wall extends from an inner edge of the at least one notch and defines the at least one slot together with the at least one notch.

17. The power distribution module according to claim 15, wherein the at least one slot is L-shaped.

18. The power distribution module according to claim 11, comprising a frame body, wherein the frame body is disposed on the device body, the frame body is provided with at least one guiding inclined surface, and the at least one guiding inclined surface is configured to guide the main body to move toward the frame body.

19. The power distribution module according to claim 11, wherein the handle is provided with a grip portion, and the grip portion is configured to receive a force to rotate the handle relative to the main body and is configured to be stopped by the anti-removal frame.

* * * * *